(12) United States Patent
Kramer et al.

(10) Patent No.: US 6,574,108 B1
(45) Date of Patent: Jun. 3, 2003

(54) SELECTIVE PCB VIA LOCATION TO ENHANCE COOLING

(75) Inventors: Allen Nicholas Kramer, Hudson, WI (US); Mark Berg, Mound, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 226 days.

(21) Appl. No.: 09/652,904

(22) Filed: Aug. 29, 2000

Related U.S. Application Data

(60) Provisional application No. 60/151,738, filed on Aug. 31, 1999.

(51) Int. Cl.[7] .................................................. H05K 7/20
(52) U.S. Cl. ........................ 361/719; 174/252; 361/720
(58) Field of Search .............................. 174/16.3, 252, 174/261–265; 361/704, 707, 719–721, 767–768, 777, 794; 428/901; 257/706–707, 712–713

(56) References Cited

U.S. PATENT DOCUMENTS

| | | | | |
|---|---|---|---|---|
| 5,590,030 A | * | 12/1996 | Kametani et al. | ........... 361/794 |
| 5,784,262 A | | 7/1998 | Sherman | |
| 5,933,324 A | * | 8/1999 | Barrett | ........................ 361/719 |
| 6,037,547 A | | 3/2000 | Blish, II | |
| 6,212,076 B1 | * | 4/2001 | Macquarrie et al. | ........ 361/720 |

* cited by examiner

*Primary Examiner*—Gregory Thompson
(74) *Attorney, Agent, or Firm*—Derek J. Berger; Shawn B. Dempster

(57) ABSTRACT

Disclosed is a printed circuit board (PCB) layout for increasing the ability of the PCB to transfer heat away from a component mounted thereon. The locations of signal vias in the PCB are selected so as to define continuous pathways in a PCB heat sink layer. This allows heat to be effectively conducted away from thermal vias connected to heat sink layer, thereby preventing PCB-mounted components from overheating.

18 Claims, 7 Drawing Sheets

SELECTIVE PCB VIA LOCATION TO ENHANCE COOLING

CROSS REFERENCE TO RELATED APPLICATIONS

This application claims the benefit of U.S. Provisional Application No. 60/151,738, filed Aug. 31, 1999.

FIELD OF THE INVENTION

This invention relates generally to printed circuit boards, and more particularly, but not by way of limitation, to dissipation of heat in printed circuit boards.

BACKGROUND OF THE INVENTION

Integrated circuit chips (ICs) for controlling electronic devices are currently cut from silicon wafers and packaged so that they can be electrically attached to circuitry of a printed circuit board (PCB). The top surface of the PCB typically includes electrical contacts to which terminals of the IC package may be connected.

PCBs are typically made of layers of an insulating substrate material interleaved with signal layers, which include traces connecting PCB-mounted components to other components. The use of multiple signal layers increases the ability to route these traces along the PCB, because they are able to pass under or over components and other traces of the PCB, rather than around them. Ground and power planes are typically interspersed between these signal layers. ICs and other components coupled to the PCB may tap their ground and power sources from these ground and power planes.

In multi-layer PCBs, it is known to route electrical signals from layer to layer by through-holes, or vias. Vias are holes which extend through the PCB layers and are typically internally lined with conductive material to electrically connect traces or mounting contacts to another circuit board layer. Openings for these signal vias are usually formed by mechanically punching any one or many PCB layers prior to PCB lamination.

As technology has moved forward, ICs have been designed to carry out more functions of greater complexity. As a result, the number of electrical contact points for power supply and input-output signals to and from ICs continues to increase. IC packages that can handle an increased number of electrical contact points are therefore required. Ball grid array (BGA) chip packaging, which utilizes solder balls on its mounting surface instead of pins for mounting to PCB contacts, are especially useful because they allow for more contacts per unit package area.

However, faster, more complex Ics rely on BGAs to dissipate more power than. their technological predecessors. If a sufficient amount of heat generated by an IC is not removed, its performance may be degraded, and the chip may even be destroyed as a result. Therefore, it is necessary to design heat removal systems into computer systems that use high-speed ICs.

Many effective methods have traditionally been used for removing this heat. For example, fans can be provided for generating airflow. However, fans require additional costs as well as additional space no longer available in electronic devices which are designed to be ever smaller. As another example, heat sink layers can be added to the IC package substrate, the PCB, or both. However, these additional layers also give rise to additional costs associated with both materials and manufacture.

One inexpensive way in which heat has been removed from ICs has been to conduct it into a preexisting heat sink layer of the PCB. A ground plane, for example, is made of a highly conductive material such as copper, extends throughout the PCB and may therefore be effective in dissipating heat. Because the PCB already includes a ground plane, this arrangement does not require the costs associated with providing additional heat sink layers. Heat can be conducted into the ground plane from a BGA package through ground vias in the center of the BGA substrate directly below the IC. These ground vias are connected to solder ball terminals on the lower surface of the BGA package for connection to contacts on the upper surface on the PCB. Corresponding ground vias are also provided in the PCB so as to connect the contacts to the ground plane. Because these ground vias are designed to conduct heat, they are also known as "thermal" vias. These thermal vias have been effective in removing heat from ICs to a certain extent.

However, as ICs have continued to increase in complexity, thereby requiring even more power for operation, it has been found that mere provision of thermal vias is no longer sufficient for adequate heat removal. This is in part because the preexisting heat sink layers of the PCB are perforated by holes which decrease their effectiveness in dissipating heat. These holes are necessary in order to allow signal vias to extend through the heat sink layers while remaining insulated from them. In the case of a BGA package, the holes associated with signal vias surround the area of the heat sink layer connected to the thermal vias, thereby preventing effective transfer of heat from the area beneath the IC. What is needed is a way to increase transfer of heat away from the IC without incurring the additional costs associated with traditional heat-removal methods.

SUMMARY OF THE INVENTION

The present invention is an improved PCB layout for increasing the ability of the PCB to transfer heat away from a component mounted thereon. Signal vias in the PCB are positioned so as to define pathways to a surrounding heat sink layer of a PCB. This allows heat to be more effectively conducted away from thermal vias to the heat sink layer. Additional features and benefits will become apparent upon a review of the attached figures and the accompanying description.

DETAILED DESCRIPTION OF THE INVENTION

Figure 1:
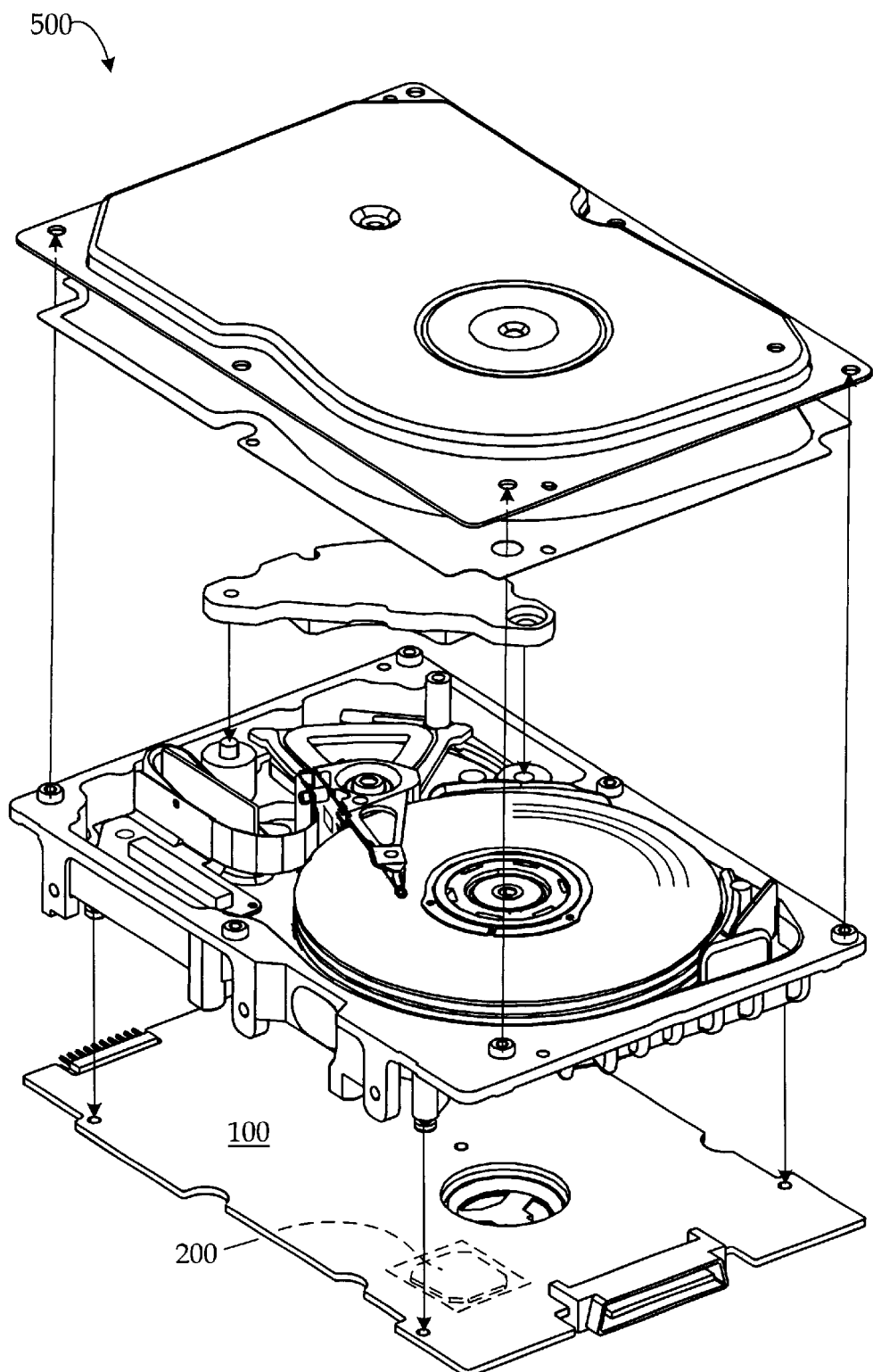
FIG. 1 shows an exploded view of an electronic device utilizing a printed circuit board.
Figure 2:
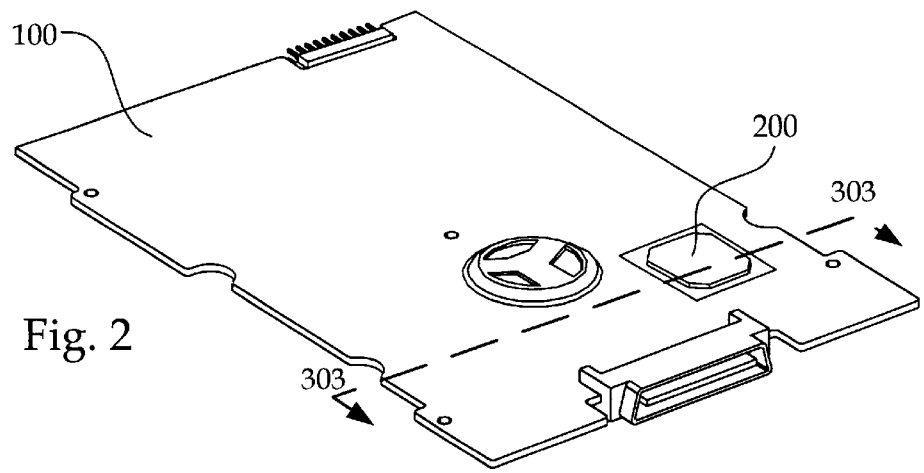
FIG. 2 shows a printed circuit board with an integrated circuit chip package mounted thereon.

Turning now to the drawings and specifically to FIG. 1, shown is an exploded view of an example of an electronic apparatus 500 in which the present invention is particularly useful. The electronic apparatus 500 is controlled in part by a variety of electronic components mounted to a printed circuit board (PCB) 100 which is electronically connected to the apparatus 500. FIG. 2 shows an example of an electronic component 200 mounted to the PCB 100.

Figure 3:
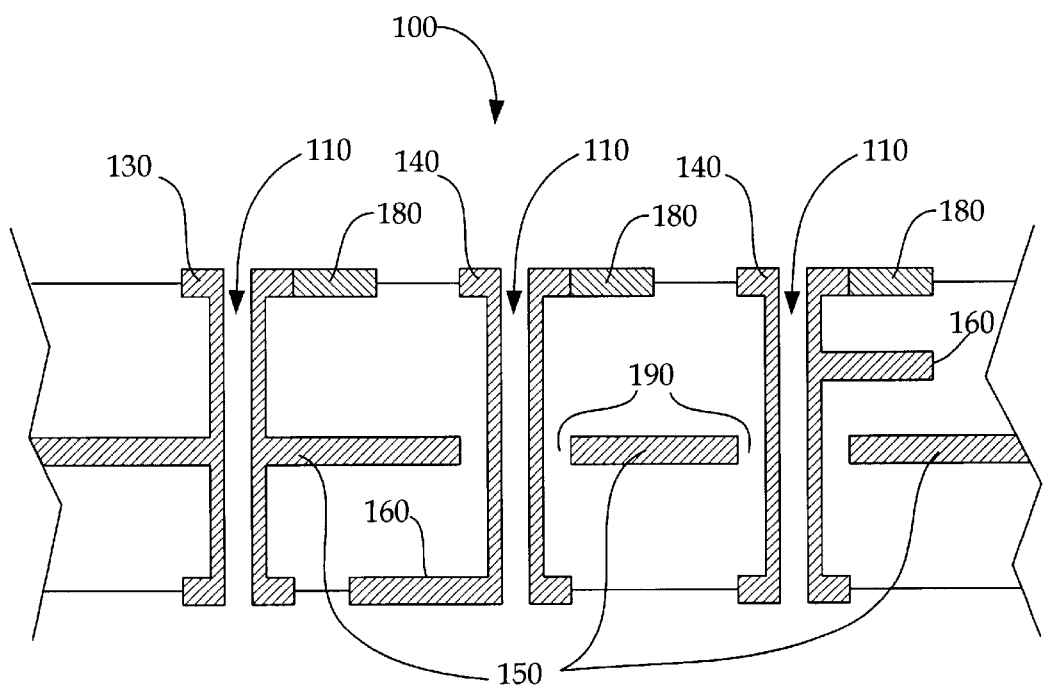
FIG. 3 depicts a cross-sectional view of the printed circuit board of FIG. 2.

FIG. 3 shows a cross-sectional view of the PCB 100 in plane 303 of FIG. 2. Via holes 110 extend through the PCB 100. Each via hole 110 is internally provided with an electrically conductive material forming vias 130 and 140. The top surface of the PCB 100 includes mounting contacts 180 which can be connected to terminals of component 200 and which are also connected to vias 130 and 140. In this example, the PCB 100 is shown to have a ground plane 150 and two signal layers 160, one being an external layer and another being an internal layer. This PCB arrangement is presented only by way of illustration, as a PCB may in reality have any number of ground and power planes and signal layers. Ground plane 150 is formed of a single sheet, but has holes 190 formed therethrough, thereby allowing vias 140 to pass through the ground plane 150 without making electrical contact with it.

Figure 4:
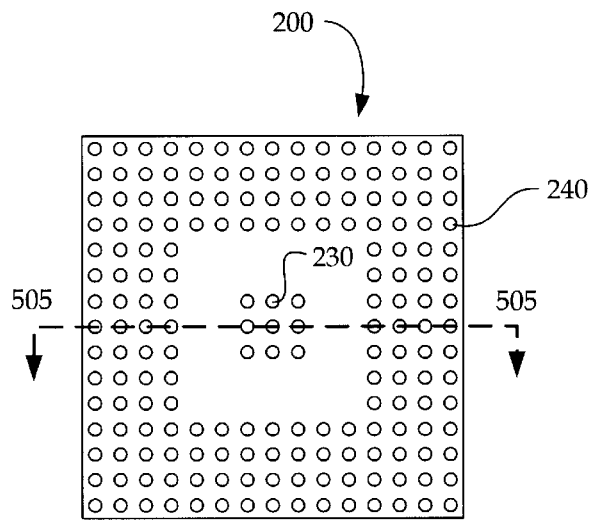
FIG. 4 shows a bottom view of a ball grid array package.

As seen in FIG. 2, one of the electronic components which may be used to control the electronic apparatus 500 may be carried by a ball grid array package (BGA) 200. FIG. 4 shows a bottom view of one example of a BGA 200, including centrally located solder balls 230 and peripherally located solder balls 240. These solder balls 230, 240 may be connected to mounting contacts 180 of PCB 100. Balls 230 are thermal balls, which will be connected to vias 130 which are in turn connected to a preexisting heat sink layer 152 of the PCB. Current IC and BGA designs make it convenient to use a ground plane 150 as the heat sink layer. However, it should be understood that a power plane would be equally efficient as a heat conductor. Balls 240 are primarily signal balls, or I/O balls, which will be connected to signal vias 140 which are in turn connected to signal layers 160. Of course, some of the vias 140 could also be connected to power and ground planes of the PCB 100.

Figure 5:
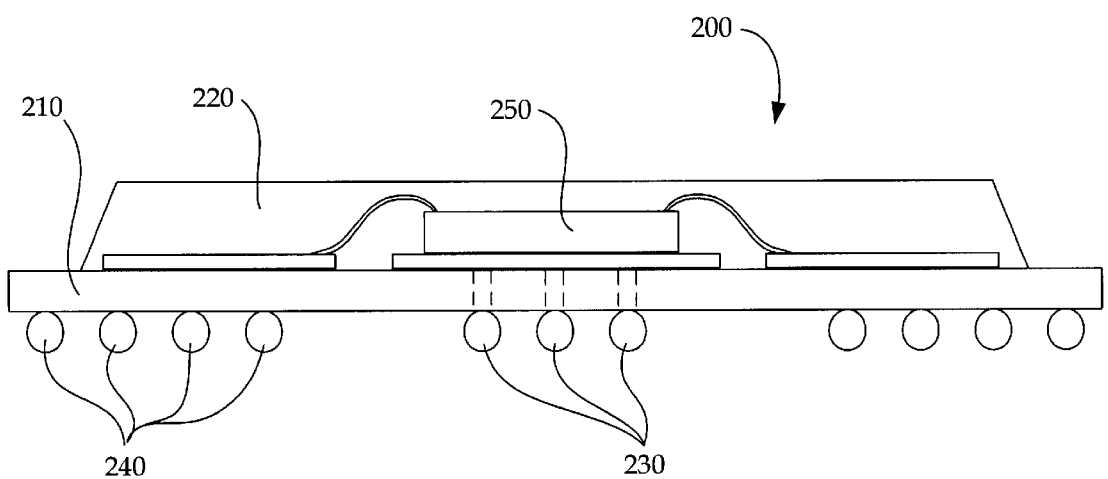
FIG. 5 depicts a cross-sectional view of the ball grid array package of FIG. 4.

FIG. 5 depicts a cross-sectional view of the BGA 200 of FIG. 4 along line 505. This BGA 200 carries an integrated circuit chip 250. The BGA includes a substrate 210 which carries the chip 250 along with its associated connections within an overmold 220. Thermal balls 230 are located below centrally located chip 250. As a result, they advantageously serve to conduct heat away from chip 250, through their associated vias 130 and into heat sink layer 152, so as to allow the heat to spread through the heat sink layer 152 away from the chip 250.

Figure 6:
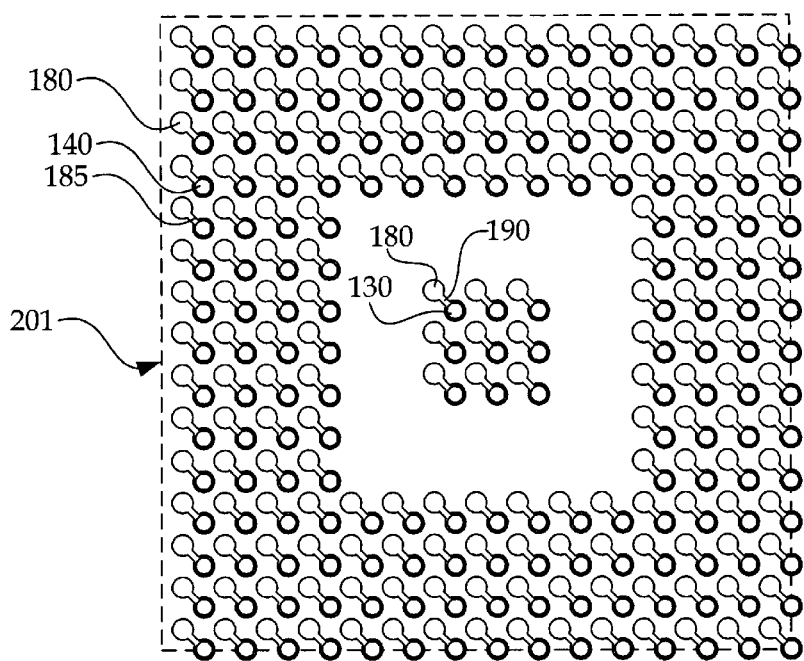
FIG. 6 depicts a top view of contacts and vias on the PCB upper surface where the signal vias have not been located as per the present invention.
Figure 7:
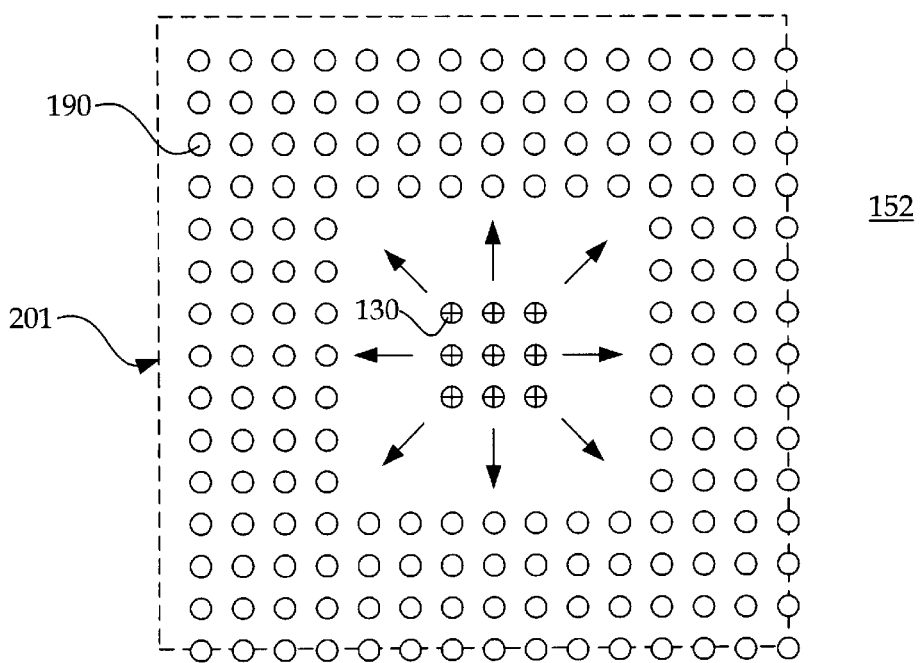
FIG. 7 depicts a top view of a PCB heat sink layer including holes corresponding to the signal via locations shown in FIG. 6.

FIG. 6 depicts the top surface of PCB 100 beneath the footprint 201 of BGA 200. Mounting contacts 180 are shown to be connected to thermal vias 130 and signal vias 140 by traces 185. It has been found that when in operation, the average temperature of the mounting contacts associated with thermal vias 130 is 5 degrees C to 10 degrees C hotter than the average temperature of the contacts associated with signal vias 140, and may even be more than 20 degrees C hotter. It should be understood that FIG. 7 is simplified for purposes of illustration. Routing of traces 185 between contacts 180 to their respective vias 140 could be more complex. Some contacts 180 might also be routed through traces 185 extending along the PCB top surface to other areas of the PCB 100 without using vias 140. However, FIG. 6 fairly depicts the typical practice in PCB designs, whereby vias 130, 140 are dropped through the PCB 100 near to their associated contacts 180 as a matter of convenience.

FIG. 7 shows a portion of the heat sink layer 152 beneath the footprint 201 of BGA 200. The thermal vias 130 are located as shown in FIG. 6. Holes 190 are formed in the heat sink layer 152 to allow signal vias 140 to extend therethrough, as explained above in reference to FIG. 3. FIG. 7 clearly shows the problems presented by signal vias 140 as they relate to thermal dissipation through the heat sink layer 152. Ideally, the heat sink layer 152 would extend continuously throughout the PCB 100. This would allow for optimal conduction of heat away from chip 250. However, heat sink layer 152 is in fact interrupted by holes 190 throughout the periphery of the footprint 201. As heat is conducted through the heat sink layer 152 away from thermal vias 130, its only path of escape from beneath the BGA 200 is along the narrow heat sink layer portions between holes 190. Heat transfer away from the thermal vias 130 is therefore inefficient, resulting in accumulation of heat beneath the chip 250.

Figure 8:
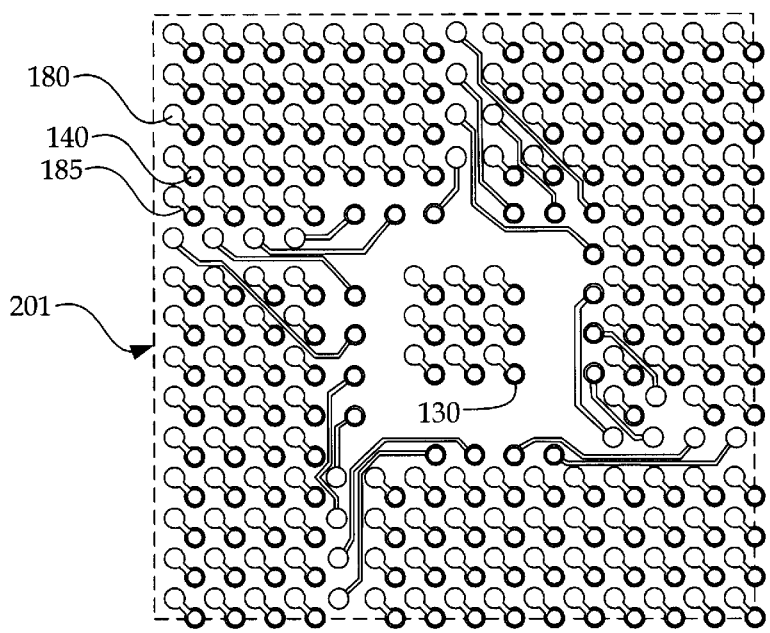
FIG. 8 shows a top view of contacts and vias on the PCB upper surface where the signal vias have been advantageously placed for enhanced cooling.

FIG. 8 depicts the top surface of PCB 100 beneath the footprint 201 of BGA 200 where some signal vias 140 have been relocated. The mounting contacts 180 remain in the same locations as in FIG. 6, such that nothing changes in the way BGA 200 connects to PCB 100. Moreover, the number of signal vias 140 remains the same is in FIG. 6 However, the locations of signal vias 140 have been changed and corresponding traces 185 have been rerouted along the top surface of the PCB 100 from their respective mounting contacts 180.

Figure 9:
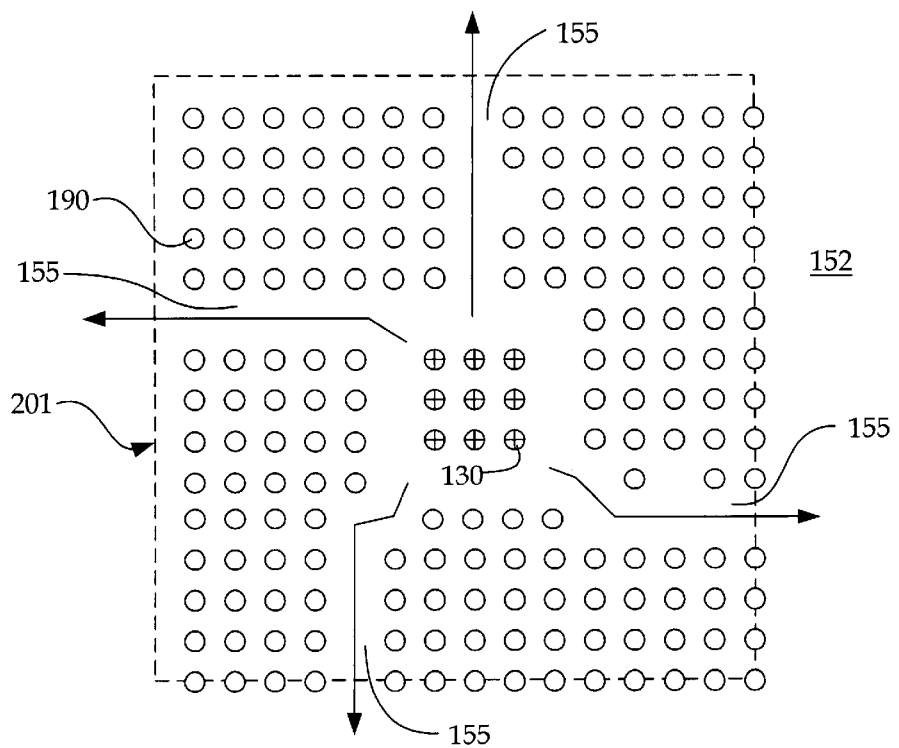
FIG. 9 shows a top view of a PCB heat sink layer including heat-conducting pathways defined by holes corresponding to the signal via locations shown in FIG. 8.

FIG. 9 shows the portion of the heat sink layer 152 beneath the footprint 201 of BGA 200 after signal vias 140 have been relocated as in FIG. 8. Holes 190 in the heat sink layer 152 are now located so as to correspond to these relocated signal vias 140. The result, as depicted by the arrows in FIG. 9, is that pathways 155 are created among the holes 190 in the ground plane 150. These wide pathways 155 in the heat sink layer 152 allow heat to be conducted much more efficiently away from thermal vias 130. This allows more heat to be removed from the chip 250 under normal operating conditions, thereby reducing the probability of equipment failure.

While FIG. 9 shows an embodiment having four pathways 155, it should be evident that a given layout may have more or fewer pathways. For one BGA/PCB combination, it has been possible to create as many as thirteen pathways, but it should be recognized that layouts may differ, depending upon heat removal requirements and trace routing limitations.

Figure 12:
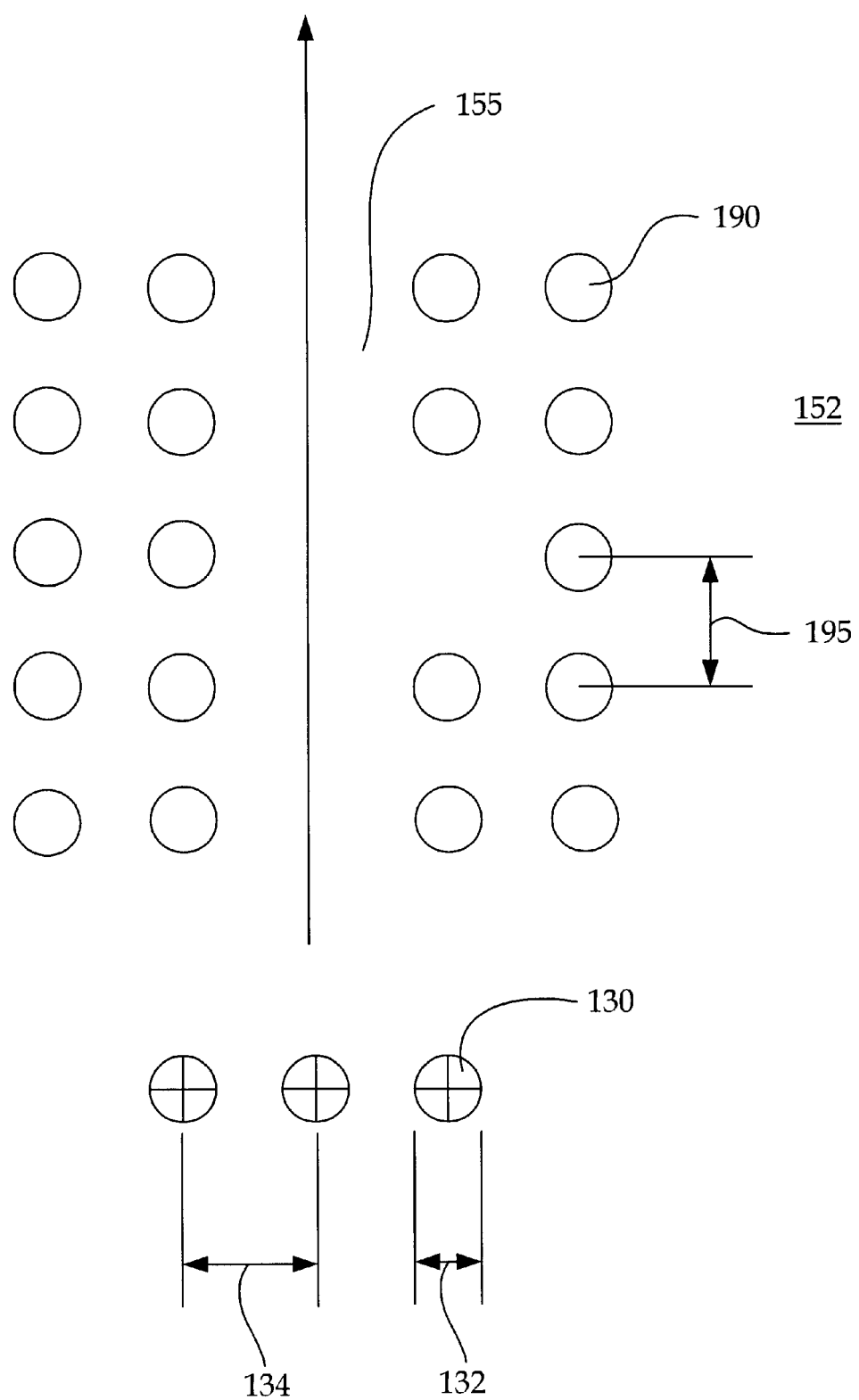
FIG. 12 show a portion of the heat sink layer including hole and via dimensional relationships.

To simplify PCB layout design, vias are typically laid out in a grid on the PCB 100 as shown in FIGS. 6–9. It follows, then, that when pathways 155 are designed into these kinds of layouts, they will advantageously be defined by holes 190 in the heat sink layer which are spaced by at least twice the normal grid spacing. FIG. 12 shows vias 130 to have a width 132 and that their centers are typically spaced a distance 134. In the overall grid layout of FIG. 12, the pathways 155 will have a minimum width of approximately two times the normal spacing 134 minus via width 132. Also seen in FIG. 12 are holes 190 in heat sink layer 152 having a width 195, and it should be clear that in this overall grid layout the pathways 155 will have a minimum width defined by holes 190 spaced by a distance two times the normal spacing 195.

Figure 10:
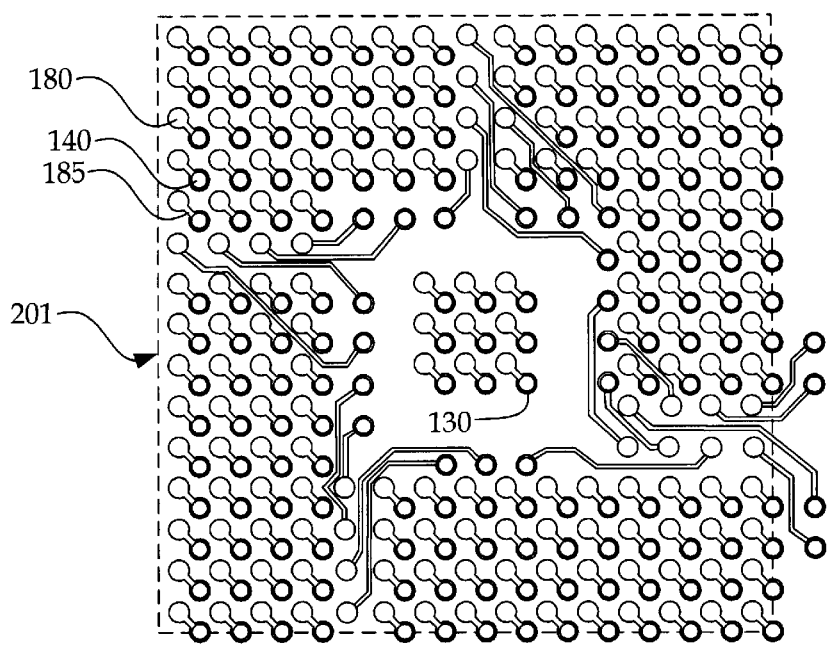
FIG. 10 shows a top view of contacts and vias on the PCB upper surface where the signal vias have been further advantageously relocated for enhanced cooling.
Figure 11:
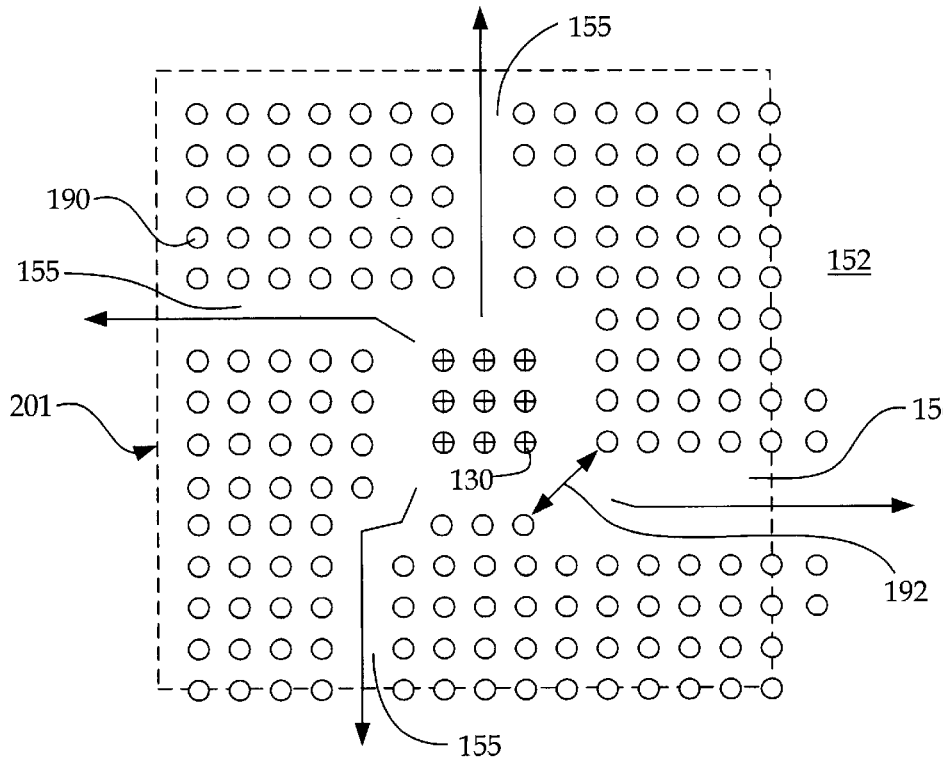
FIG. 11 shows a top view of a PCB heat sink layer including heat-conducting pathways defined by holes corresponding to the signal via locations shown in FIG. 10.

Of course, if additional rows of via holes 190 could be removed from the. heat sink layer 152, thereby further widening pathways 155, heat dissipation would be even more efficient. FIG. 10, for example, shows an embodiment where additional vias 140 along the rightmost pathway 155 have been removed. FIG. 11 shows the corresponding heat sink layer 152 where the holes 190 have been relocated to create a wider pathway 156 having a minimum dimension 192.

It is also contemplated that pathways 155 could be narrower than that shown in FIG. 9 where not all of the vias are aligned in a single grid. While narrower pathways would be less efficient than the arrangement of FIG. 9, what is important is that the vias 140 (and thereby holes 190) nonetheless define pathways 155 of a width at least slightly greater than the normal via spacing, such that heat is more efficiently conducted along these pathways 155 through the region of the heat sink layer 152 containing holes 190. In other words, the pathways 155 will have a minimum width greater than the normal spacing 134 minus via width 132. It should also be clear that the pathways 155 may have a minimum width defined by holes 190 spaced by a distance greater than the normal spacing 195.

Alternately characterized, a first contemplated embodiment of the invention includes a printed circuit board 100 having a horizontal mounting area 201 configured to couple directly to an electronic device 200. The printed circuit board 100 has several contacts 180 within the mounting area 201. A first set of the contacts 180 has an average temperature at least 5 degrees C hotter than an average temperature of a second set of the contacts 180. A first set of metal vias 130, each having a width X shown as 132, is coupled to the first, hotter set of contacts 180. Each via 130 is offset from another via 130 of the first set of vias by a distance Y shown as 134. A horizontal heat sink layer 152 substantially surrounds the first set of vias 130, and is thermally coupled to them by a plurality of discrete horizontal thermal conduits 155. Each conduit has a minimum width greater than Y-X. Optionally, this minimum distance may be greater than 2Y-X. A second set of metal vias 140 may optionally be coupled to the second set of contacts 180, such that each of the second set of vias 140 passes between two of the horizontal thermal conduits 155. The heat sink layer 152 may optionally be formed as part of the ground plane 150 of the printed circuit board 100. Moreover, the conduits 155 may optionally be formed as part of the ground plane 150.

Alternately characterized, a second contemplated embodiment of the invention includes a printed circuit board 100 with an upper surface having a mounting area 201 with contacts 180 configured to connect to terminals 230, 240 of an electronic device 200. The printed circuit board 100 includes a metal heat sink layer 152, as well as a first set of vias 130 which thermally connect a first set of the contacts 180 to a first region of the heat sink layer 152 beneath the mounting area 201. A second region of the heat sink layer 152 beneath the mounting area 201 has a set of holes 190 extending through it. The holes 190 are arranged to define a plurality of predetermined pathways 155 configured to allow heat to be conducted away from the first region and along the plurality of pathways 155 through the second region, the plurality of pathways 155 conducting heat more effectively than the remainder of the second region. At least two of the holes 190 may have centers spaced by a distance Z as shown at 195, and the pathways 155 may optionally be defined entirely by holes 190 having centers spaced by a distance greater than Z. Optionally, the pathways 155 may be defined entirely by holes 190 having centers spaced by a distance of at least 2Z. The printed circuit board 100 may also include a second set vias 140 which are connected to a second set of the contacts 180 and which extend through the holes 190 in the heat sink layer 152. The heat sink layer 152 may optionally be formed as part of the ground plane 150 of the printed circuit board 100. As a further option, the first region may be surrounded by the second region. The first region may optionally be located beneath a substantial center of the mounting area 201. As a further option, the electronic device 200 to be connected may be an integrated circuit in a BGA package.

From the foregoing, it is apparent that the present invention is particularly suited to provide the benefits described above. While particular embodiments of the invention have been described herein, modifications to the embodiments which fall within the envisioned scope of the invention may suggest themselves to one of skill in the art who reads this disclosure. Therefore, the scope of the invention should be considered to be limited only by the following claims.

What is claimed is:

1. printed circuit board having a horizontal mounting area configured to couple directly to an electronic device, the printed circuit board comprising:

several contacts within the mounting area, a first set of the contacts having an average operating temperature at least 5 degrees C hotter than an average operating temperature of a second set of the contacts;

a first set of metal vias coupled to the first set of contacts, each via having a width X, each via being offset from a nearest via of the first set of vias by a distance Y; and a horizontal heat sink layer substantially surrounding the first set of vias, the heat sink layer thermally coupled to the first set, of vias by a plurality of discrete horizontal thermal conduits each having a minimum width greater than Y-X.

2. A printed circuit board according to claim 1, in which the minimum width is greater than 2Y-X.

3. A printed circuit board according to claim 1, further comprising:

a second set of metal vias coupled to the second set of contacts, each of the second set of metal vias passing between two of the horizontal thermal conduits.

4. A printed circuit board according to claim 1, in which the heat sink layer comprises a ground plane of the printed circuit board.

5. A printed circuit board according to claim 1, in which the thermal conduits form part of a ground plane of the printed circuit board.

6. The printed circuit board according to claim 1, in which the conduits are configured to underlie the electronic device.

7. The printed circuit board according to claim 3, in which the horizontal heat sink layer substantially surrounds the second set of vias.

8. A printed circuit board, comprising:

an upper surface having a mounting area with contacts configured to connect to terminals of an electronic device;

a metal heat sink layer;

a first set of vias thermally connecting a first set of the contacts to a first region of the heat sink layer beneath the mounting area;

a set of holes extending through a second region of the heat sink layer beneath the mounting area, the holes further being arranged to define a plurality of predetermined pathways configured to allow heat to be conducted away from the first region and along the plurality of pathways through the second region, the plurality of pathways conducting heat more effectively than the remainder of the second region.

9. The printed circuit board as claimed in claim 8, at least two of the holes having centers spaced by a distance Z, the plurality of pathways being defined entirely by holes having centers spaced by a distance greater than Z.

10. The printed circuit board as claimed in claim 8, at least two of the holes having centers spaced by a distance Z, the plurality of pathways being defined entirely by holes having centers spaced by a distance of at least 2Z.

11. The printed circuit board as claimed in claim 8, further comprising:

a second set vias connected to a second set of the contacts, the second set of vias extending through the holes in the heat sink layer.

12. The printed circuit board as claimed in claim 8, the heat sink layer comprising a ground plane of the printed circuit board.

13. The printed circuit board as claimed in claim 8, the first region being surrounded by the second region.

14. The printed circuit board as claimed in claim 8, the first region being located beneath a substantial center of the mounting area.

15. The printed circuit board as claimed in claim 8, wherein the electronic device is an integrated circuit in a ball grid array package.

16. The printed circuit board according to claim 8, in which the mounting area lies in a horizontal plane, the contacts being generally planar and extending horizontally along the mounting area.

17. The printed circuit board according to claim 8, in which the first set of contacts are configured to underlie the electronic device.

18. The printed circuit board according to claim 11, in which the second set of vias does not contact the heat sink layer.

* * * * *